United States Patent [19]

Runaldue

[11] Patent Number: 5,036,492
[45] Date of Patent: Jul. 30, 1991

[54] CMOS PRECHARGE AND EQUALIZATION CIRCUIT

[75] Inventor: Thomas J. Runaldue, San Jose, Calif.

[73] Assignee: Advanced Micro Devices, Inc., Sunnyvale, Calif.

[21] Appl. No.: 480,401

[22] Filed: Feb. 15, 1990

[51] Int. Cl.$^5$ ............................................. G11C 7/00
[52] U.S. Cl. ................................... 365/203; 365/202
[58] Field of Search .......... 365/203, 204, 202, 189.09, 365/189.06

[56] References Cited

U.S. PATENT DOCUMENTS

| | | | |
|---|---|---|---|
| 4,712,193 | 12/1987 | Sood | 365/203 |
| 4,780,852 | 10/1988 | Kajigaya et al. | 365/203 |
| 4,893,278 | 1/1990 | Ito | 365/203 |

FOREIGN PATENT DOCUMENTS 0380091  8/1990  European Pat. Off. ............ 365/203

OTHER PUBLICATIONS

Gladstein, A. et al., "Elimination of Bitline Charging through a Thick Oxide FET Read-Only Storage Device", IBM Technical Disclosure Bulletin, vol. 21, No. 6, November 1978, pp. 2593-2594.

Primary Examiner—Joseph A. Popek
Assistant Examiner—Jack A. Lane

[57] ABSTRACT

A CMOS precharge and equalization circuit for use with memory cells coupled between paired bit lines in a static random access memory array is constructed without the use of bleeder circuits. The precharge and equalization circuit is formed of a pair of precharge transistors and a pair of equalization transistors for precharging and equalizing the paired bit lines.

4 Claims, 2 Drawing Sheets

CMOS PRECHARGE AND EQUALIZATION CIRCUIT

BACKGROUND OF THE INVENTION

This invention relates generally to CMOS static random access memories and more particularly, it relates to an improved CMOS precharge and equalization circuit for use with CMOS memory cells which are coupled between differential paired bit lines.

In general, in CMOS static random access memories there are a plurality of memory cells which are arranged in an array forming columns of bits and rows of words where each memory cell is disposed for storing and retrieving binary information. Each memory cell may be comprised of a MOS cross-coupled latch (two inverters connected back-to-back) and a pair of coupling transistors coupled between the latch and a common set of interconnect lines. Since these interconnect lines are differential in nature, they are typically referred to as bit lines, which are used as a means for both writing information into the memory cell and sensing (reading) information from the memory cell via a differential read/write port.

As is well known in the art, sense amplifiers are used to detect or sense the binary state of one of the memory cells in the column of memory cells arranged between the differential bit lines. As memories become more and more dense, each of the columns is coupled with a higher number of memory cells. As a result, the pairs of bit lines become relatively long conductors which represent a relatively large capacitive load. The MOS latches are ordinarily not capable of providing a high current so as to charge up or discharge rapidly the capacitive load of the bit lines. Consequently, more time is required to charge and discharge the parasitic capacitive loads, thereby increasing write and read times to and from the memory cells.

Prior art solutions to this problem involves the provision of precharge and equalization circuits for precharging the bit lines to a particular value. As used herein, "precharge" defines the charging of a node to a specified voltage level and "equalization" defines the process of sharing charge between two nodes to insure an equal voltage level therebetween. Therefore, it can be seen that an important aspect of memory design is determining the voltage level to which the differential bit lines are precharged. The particular voltage level of the pairs of bit lines is an important consideration due to the characteristics of the memory cell and sensitivity of the sense amplifier.

In a cross-coupled pair sense amplifier, the amplifier feeds back to the bit lines. This is typically necessary to restore data in the selected memory cell. The amplifier senses small voltage differentials on the pair of bit lines and begins to further increase the voltage differential. In the usual practice, the precharge and equalization circuit is used to precharge and equalize the bit lines in a precharge cycle prior to a read cycle. That is, the differential bit lines must have null data on them. If the differential bit lines are not equalized properly, residual data on the bit lines may be transferred to the memory cell during the reading process, thereby destroying memory cell data. In such instance, the small voltage differential on the bit lines would be transferred to the memory cell and amplified therein. Thus, some form of precharge and equalization circuit is generally required for the proper operation of the memory.

In FIGS. 1a and 1b, there are shown two different prior art precharge and equalization circuits which are used to precharge or set the differential bit lines BL and $\overline{BL}$ to a predefined voltage level. The circuit 10a of FIG. 1a includes a first N-channel precharge transistor N1, a second N-channel precharge transistor N2, and an equalization P-channel P1. Ideally, the precharge voltage will be set on the respective bit lines (source electrodes of the transistors N1 and N2) at a threshold drop $V_{Tn}$ below the supply potential VCC or $V_{pre} = VCC - V_{Tn}$, where $V_{Tn}$ is a body-effect enhanced threshold. The supply potential VCC is typically at +5.0 volts, and the threshold drop $V_{Tn}$ varies between 0.6 and 0.9 volts. However, in actual practice the transistors N1 and N2 will tend to leak so that the voltage on the bit lines BL and $\overline{BL}$ may be charged to the full value of the supply potential VCC. In order to prevent the bit lines from charging all the way up to the supply potential VCC, a bleeder circuit 12a is usually added on each bit line so as to leak charge away from the bit lines. The bleeder circuit 12 is quite conventional and is generally formed of a polyresistor or an active device. Thus, this leakage of charge serves to insure that the precharge voltage will be maintained approximately at the $VCC - V_{Tn}$ level.

Similarly, the circuit 10b of FIG. 1b includes a first P-channel precharge transistor P2, a second P-channel precharge transistor P3, and an equalization N-channel transistor N3. Again, a bleeder circuit 12b is usually added on each bit line so as to prevent them from charging down to the supply potential VSS. As a result, the precharge voltage will be maintained approximately at a threshold drop $V_{Tp}$ above the supply potential VSS or $V_{pre} = VSS + V_{Tp}$. The supply potential VSS is typically at 0 volts, and the threshold drop varies between $-0.6$ and 0.9 volts.

It will be understood that in a standard random access memory array there would be additional bit line pairs or columns, each bit line in each of the columns being coupled to a bleeder circuit 12a or 12b similar to that shown in respective FIGS. 1a and 1b. For example, there may be 32 or 64 columns so as to form a 32-bit or 64-bit word. Further, each column may contain any number of bit memory cells connected between the corresponding paired bit lines. There may be perhaps 128 or 256 or more of these memory cells connected between each paired bit line so as to form 128 or 256 different words.

However, the inclusion of a bleeder circuit coupled to each bit line for all of the columns in a static random access memory array increases greatly the size of the integrated circuit and adds to the complexity of the memory. In view of this, there exists a need for an improved precharge and equalization circuit for precharging the bit lines in a static random access memory array without requiring the use of bleeder circuits. It should be noted that by eliminating of bleeder circuits there is realized a savings of power consumption. Further, the elimination of the bleeder circuits from each of the differential paired bit lines will provide reduced bit line capacitance, thereby effecting faster READ and WRITE operations.

SUMMARY OF THE INVENTION

Accordingly, it is a general object of the present invention to provide an improved precharge and equalization circuit for use with CMOS memory cells which are coupled between differential paired bit lines.

It is another object of the present invention to provide a CMOS precharge and equalization circuit for use with CMOS memory cells which is constructed without the use of bleeder circuits, thereby reducing power consumption as well as reduced bit line capacitance.

It is another object of the present invention to provide a CMOS precharge and equalization circuit for use with memory cells coupled between paired bit lines in a static random access memory array which includes a pair of first and second precharge MOS transistors and a pair of first and second equalization MOS transistors to precharge and equalize the bit lines prior to a read operation.

In accordance with one embodiment of the present invention, there is provided a CMOS precharge and equalization circuit for use with memory cells coupled between paired bit lines in a static random access memory array which includes a first precharge N-channel MOS transistor, a second precharge N-channel MOS transistor, a first equalization P-channel MOS transistor, and a second equalization P-channel MOS transistor. The first precharge transistor has a drain connected to a supply potential and a source connected to a first bit line. The second precharge transistor has a drain connected to the supply potential and a source connected to a second bit line. The gates of the first and second precharge transistors are connected together and to a first input node for receiving a true precharge signal. The first equalization transistor has its source connected to the first bit line and its drain connected to a common node which is coupled to a current-sinking device disposed external to the memory array for sinking current. The second equalization transistor has its source connected to the second bit line and it drain connected to the common node. The gates of the first and second equalization transistors are connected together and to a second input node for receiving a complementary equalization signal.

In a second embodiment of the present invention, the precharge transistors are formed of P-channel transistors and the equalization transistors are formed of N-channel transistors.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 2B:
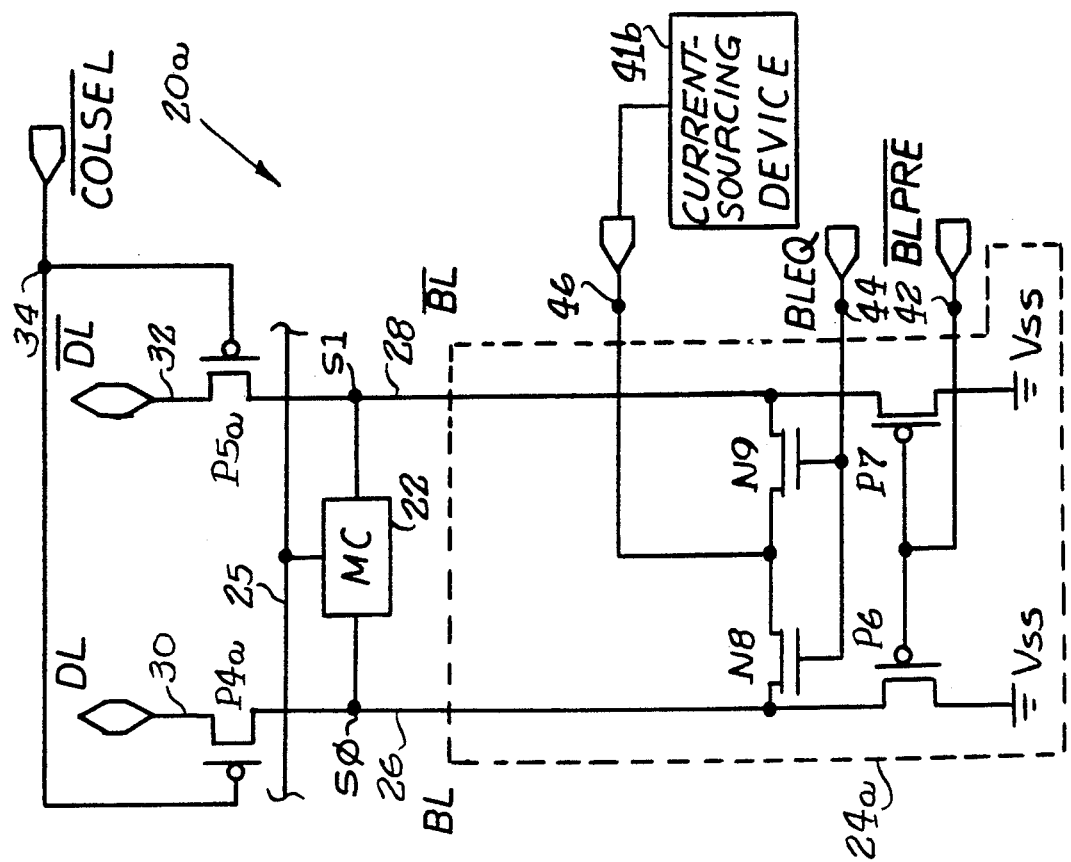
FIG. 2b is a schematic circuit diagram of a second embodiment of the present invention.
Figure 2A:
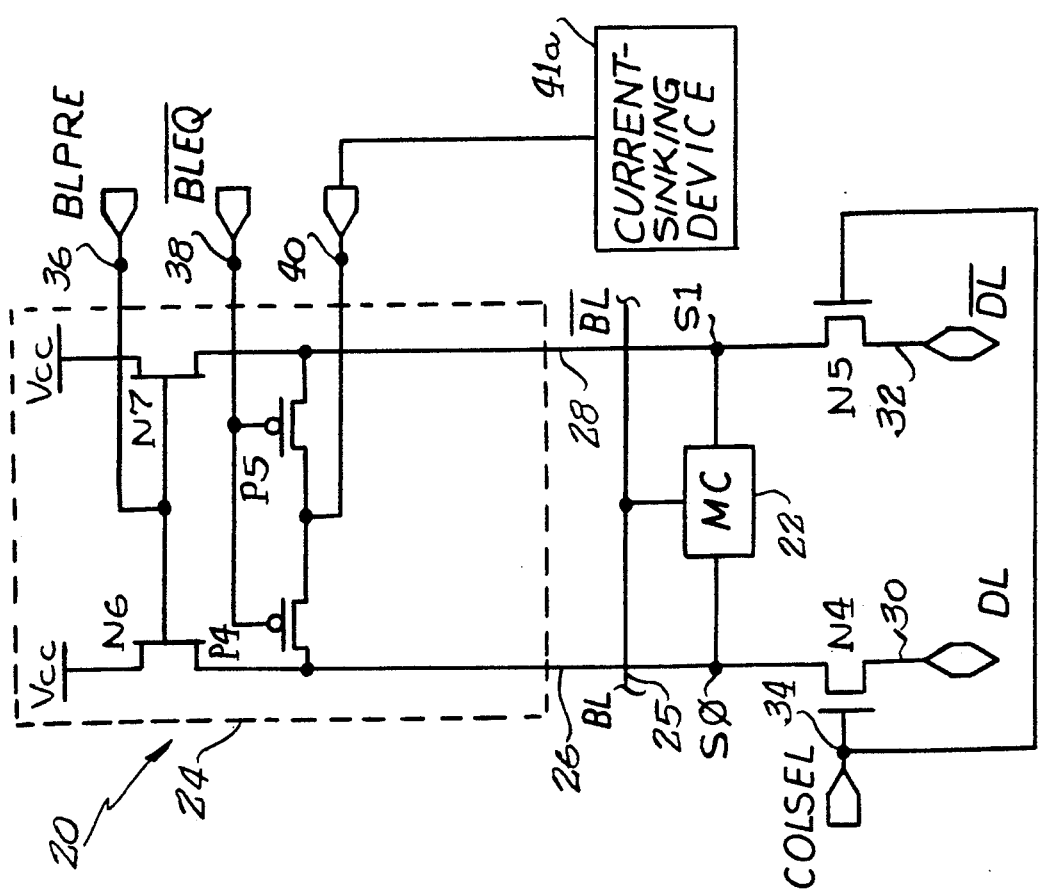
FIG. 2a is a schematic circuit diagram of a precharge and equalization circuit for precharging a pair of bit lines; constructed in accordance with the principles of the present invention.

Referring now in detail to the drawings, there is shown in FIG. 2a a portion of a static random access memory array 20 comprised generally of a bit storage or memory cell 22 and a precharge and equalization circuit 24. The memory cell 22 is connected with a word line 25 and is also connected between a first bit line 26 (BL) at a first sense node S$\emptyset$ and a second bit line 28 ($\overline{BL}$) at a second sense node S1. Each of the bit lines 26, 28 is provided with a column transistor N4, N5 for routing data into and out of the memory cell 22.

The transistor N4 has its drain-source conduction path electrodes connected between the first sense node S$\emptyset$ and a true data line 30 (DL). The transistor N5 has its drain-source conduction path electrodes connected between the second sense node S1 and a complementary data line 32 ($\overline{DL}$). The gates of the transistors N4 and N5 are connected together and to an input node 34 which receives a column select signal COLSEL.

Figures 1A, 1B:
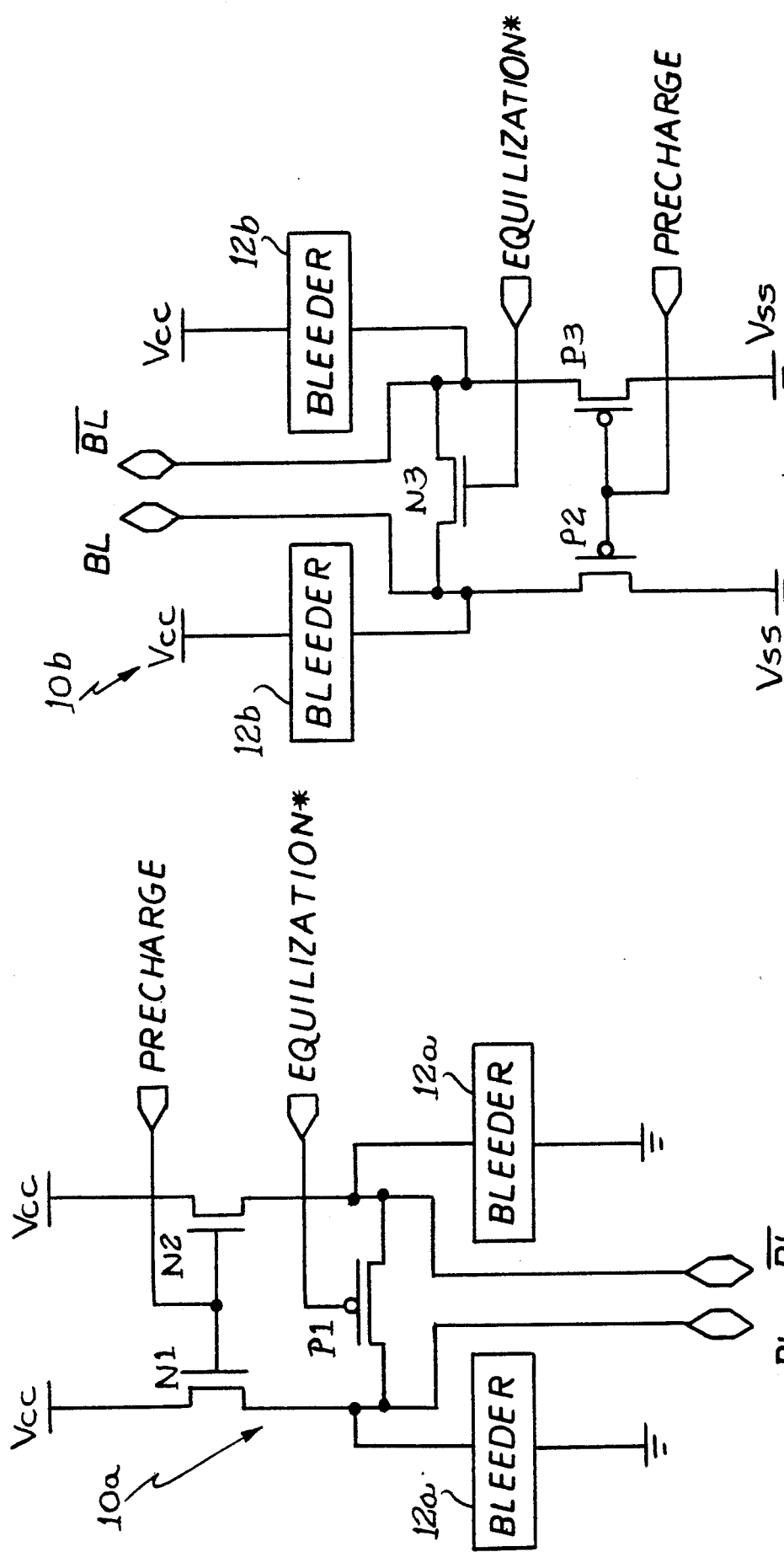
FIG. 1a is a schematic circuit diagram of a prior art precharge and equalization circuit for precharging a pair of bit lines.
FIG. 1b is a schematic circuit diagram of another prior art precharge and equalization circuit for precharging a pair of bit lines.

The precharge and equalization circuit 24 of the present invention serves to precharge the bit lines 26 and 28 to be at equal voltages prior to a sensing (read) operation of the memory cell. In contrast to the prior art precharge and equalization circuits 10a and 10b shown in FIGS. 1a and 1b, the precharge and equalization circuit 24 has been constructed without the use of bleeder circuits connected to the bit lines BL and $\overline{BL}$. The precharge and equalization circuit 24 is comprised of first precharge N-channel MOS transistor N6, a second precharge N-channel MOS transistor N7, a first equalization P-channel MOS transistor P4, and a second equalization P-channel MOS transistor P5.

It should be understood that in a static random access memory array there would be additional paired bit lines, each coupled to other precharge and equalization circuits similar to that shown in FIG. 2a, and that there would be additional memory cells coupled between the bit lines 26 and 28 than the one shown in FIG. 2. Further, some functions related to the overall operation of the memory array, not particularly relevant to the understanding of the present invention, have been purposely omitted for the sake of clarity.

The precharge transistor N6 has its drain connected to a supply potential VCC and its source connected to the bit line 26. The supply potential VCC is typically at 5.0 volts. The precharge transistor N7 has its drain also connected to the supply potential VCC and its source connected to the bit line 28. The gates of the transistors N6 and N7 are connected together and to an input node 36 which receives a true precharge signal BLPRE. When the precharge signal BLPRE is at a high or "1" logic level, the transistors N6 and N7 are turned on. As a result, the bit lines 26 and 28 at the respective sources of the transistors N6 and N7 are precharged to a specified voltage level, which is approximately one threshold drop below the supply potential VCC or VCC−$V_{Tn}$.

The equalization transistor P4 has its source connected to the bit line 26, and the equalization transistor P5 has its source connected to the bit line 28. The gates of the transistors P4 and P5 are connected together and to an input node 38 which receives a complementary equalization signal $\overline{BLEQ}$. The drains of the transistors P4 and P5 are connected together and to a common node 40 which is joined to a current-sinking device 41a external to the array of the precharge and equalization circuits 24 for sinking current. The current-sinking device 41a may be formed of a conventional active or passive loading device. When the equalization signal $\overline{BLEQ}$ is at an active low or "0" logic level, the transistors P4 and P5 are turned on, thereby connecting the bit lines 26 and 28 together so as to settle at an equalized voltage. It should be noted that the equalization signal $\overline{BLEQ}$ having the low logic level is generally delayed slightly with respect to the precharge signal BLPRE having the high logic level.

It should be apparent to those skilled in the art that the nodes 36, 38 and 40 would be shared with the other precharge and equalization circuits coupled to the additional pair bit lines. Thus, only a single current-sinking device 41a is required for the entire static random access memory array In FIG. 2b, there is a second embodiment of the precharge and equalization circuit of the present invention for use with the memory cells which are coupled between the bit lines. The precharge and equalization circuit 24a of FIG. 2b is comprised of a first precharge P-channel MOS transistor P6, a second precharge P-channel MOS transistor P7, a first equalization N-channel MOS transistor N8, and a second equalization N-channel MOS transistor N9.

The precharge transistor P6 has the source connected to a supply potential VSS and its drain connected to the bit line 26. The precharge transistor P7 has its source also connected to the supply potential VSS and its drain connected to the bit line 28. The supply potential VSS is typically at 0 volts. The gates of the transistors P6 and P7 are connected together and to an input node 42 which receives a complementary precharge signal $\overline{BLPRE}$. When the precharge signal $\overline{BLPRE}$ is at an active low or "0" logic level, the transistors P6 and P7 will be rendered conductive. Consequently, the bit lines 26 and 28 at the respective drains of the transistors P6 and P7 will again be precharged to a specified voltage level, which is approximately one threshold drop above the supply potential VSS or VSS + $V_{Tp}$.

The equalization transistor N8 has its source connected to the bit line 26, and the equalization transistor N9 has its source connected to the bit line 28. The gates of the transistors N8 and N9 are connected together and to an input node 44 which receives a true equalization signal BLEQ. The drains of the transistors N8 and N9 are connected together and to a common node 46 which is connected to a current-sourcing device 41b external to the array of the precharge and equalization circuits 24a for sourcing current. The current-sourcing device 41b may be formed of a conventional controlled current source device. When the equalization signal BLEQ is at a high or "1" logic level, the transistors N8 and N9 are turned on, thereby connecting the bit lines 26 and 28 together so as to settle at an equalized voltage.

The precharge and equalization circuits 24 and 24b of the present invention have the following advantages of the prior art:

(a) there is eliminated the use of bleeder circuits connected to each one of the paired bit lines by adding a second equalization transistor and using a single current-sinking or current-sourcing device for all of the paired bit lines;

(b) the current-sinking or current-sourcing device is disabled during the READ and WRITE operations to the memory cell, thereby allowing lower power operations and a faster READ/WRITE operation;

(c) the number of circuit components has been significantly reduced so as to lower the power consumption; and (d) the elimination of the bleeder circuit reduces the bit line capacitance thereby permitting faster memory operations.

From the foregoing detailed discussion, it can thus be seen that the present invention provides an improved precharge and equalization circuit for use with memory cells coupled between paired bit lines in a static random access memory array without requiring the use of bleeder circuits. The precharge and equalization circuit of the present invention includes a pair of first and second precharge transistors and a pair of first and second equalization transistors.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A CMOS precharge and equalization circuit for use with memory cells coupled between paired bit lines in a static random access memory array comprising:

a first precharge N-channel MOS transistor having its drain connected to a supply potential and its source connected to a bit line;

a second precharge N-channel MOS transistor having its drain connected to the supply potential and its source connected to a second bit line;

said first and second precharge transistors have their gates connected together and to a first input node for receiving a true precharge signal;

a first equalization P-channel MOS transistor having its source connected to the first bit line and its drain connected to a common node which is coupled to current-sinking means disposed external to the memory array for sinking current;

a second equalization P-channel MOS transistor having its source connected to the second bit line and its drain connected to the common node; and said first and second equalization transistors having their gates connected together and to a second input node for receiving a complementary equalization signal.

2. The CMOS precharge and equalization circuit as claimed in claim 1, wherein the sources of said N-channel transistors are precharged to a specified voltage level approximately equal to one threshold drop below the supply potential.

3. A CMOS precharge and equalization circuit for use with memory cells coupled between paired bit lines in a static random access memory array comprising:

a first precharge P-channel MOS transistor having its source connected to a supply potential and its drain connected to a bit line;

a second precharge P-channel MOS transistor having its source connected to the supply potential and its drain connected to a second bit line;

said first and second precharge transistors have their gates connected together and to a first input node for receiving a complementary precharge signal;

a first equalization N-channel MOS transistor having its source connected to the first bit line and its drain connected to a common node which is coupled to current-sourcing means disposed external to the memory array for sourcing current;

a second equalization N-channel MOS transistor having its source connected to the second bit line and its drain connected to the common node; and said first and second equalization transistors having their gates connected together and to a second input node for receiving a true equalization signal.

4. The CMOS precharge and equalization circuit as claimed in claim 3 wherein the drains of said P-channel transistors are precharged to a specified voltage level approximately equal to one threshold drop above the supply potential.

* * * * *